United States Patent
Wang et al.

(10) Patent No.: US 9,438,345 B2
(45) Date of Patent: Sep. 6, 2016

(54) OPTICAL MODULE AND FABRICATION METHOD THEREOF

(71) Applicant: HUAWEI TECHNOLOGIES CO., LTD., Shenzhen, Guangdong (CN)

(72) Inventors: Liping Wang, Shenzhen (CN); Xiquan Dai, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/557,985

(22) Filed: Dec. 2, 2014

(65) Prior Publication Data

US 2015/0131995 A1 May 14, 2015

Related U.S. Application Data

(63) Continuation of application No. PCT/CN2013/084265, filed on Sep. 26, 2013.

(30) Foreign Application Priority Data

Apr. 28, 2013 (CN) .......................... 2013 1 0155648

(51) Int. Cl.
*H04B 10/00* (2013.01)
*H04B 10/27* (2013.01)
(Continued)

(52) U.S. Cl.
CPC .............. *H04B 10/27* (2013.01); *G02F 1/17* (2013.01); *H01S 5/0265* (2013.01); *H04B 10/505* (2013.01); *H04B 10/564* (2013.01);
(Continued)

(58) Field of Classification Search
CPC .. H04B 10/50; H04B 10/501; H04B 10/503; H04B 10/505
See application file for complete search history.

(56) References Cited

U.S. PATENT DOCUMENTS 6,574,259 B1 6/2003 Fish et al.
2003/0095737 A1* 5/2003 Welch .................... B82Y 20/00
385/14

(Continued)

FOREIGN PATENT DOCUMENTS

CN 1361873 7/2002
CN 101222121 7/2008
(Continued)

OTHER PUBLICATIONS

Chinese Office Action dated Feb. 4, 2015 in corresponding Chinese Patent Application No. 201310155648.1.
(Continued)

*Primary Examiner* — Daniel Dobson
(74) *Attorney, Agent, or Firm* — Staas & Halsey LLP

(57) ABSTRACT

The optical module includes an optical component, a substrate, and a laser, an electro-absorption modulator, and a semiconductor optical amplifier that grow on the substrate, where: the electro-absorption modulator is located between the laser and the semiconductor optical amplifier; the laser is configured to output an optical signal after power-on; the electro-absorption modulator is configured to perform signal modulation on the optical signal output by the laser; the semiconductor optical amplifier is configured to amplify the optical signal modulated by the electro-absorption modulator; the optical component is configured to perform deflection and convergence for the optical signal amplified by the semiconductor optical amplifier and output the optical signal.

4 Claims, 6 Drawing Sheets

(51) Int. Cl.
- *G02F 1/17* (2006.01)
- *H04B 10/50* (2013.01)
- *H04B 10/564* (2013.01)
- *H01S 5/026* (2006.01)
- *H04J 14/00* (2006.01)
- *H01S 5/00* (2006.01)
- *H01S 5/50* (2006.01)
- *H01S 5/022* (2006.01)

(52) U.S. Cl.
CPC .......... *H01S5/0085* (2013.01); *H01S 5/02284* (2013.01); *H01S 5/50* (2013.01)

(56) References Cited

U.S. PATENT DOCUMENTS

| | | |
|---|---|---|
| 2004/0032646 A1 | 2/2004 | Koren et al. |
| 2004/0105476 A1 | 6/2004 | Wasserbauer |
| 2005/0006654 A1 | 1/2005 | Kang et al. |
| 2005/0018732 A1 | 1/2005 | Bond et al. |
| 2005/0185689 A1 | 8/2005 | Clark et al. |
| 2005/0244994 A1 | 11/2005 | Meliga et al. |
| 2005/0274941 A1 | 12/2005 | Ranganath |
| 2006/0018334 A1* | 1/2006 | Cho ...................... H04H 20/69 370/432 |
| 2008/0003704 A1 | 1/2008 | Katsuyama |

FOREIGN PATENT DOCUMENTS

| | | |
|---|---|---|
| CN | 103248426 | 8/2013 |
| EP | 1 840 607 A1 | 10/2007 |
| GB | 2352085 A | 1/2001 |
| WO | 03/032021 A2 | 4/2003 |
| WO | 03/032547 A2 | 4/2003 |

OTHER PUBLICATIONS

PCT International Search Report dated Jan. 2, 2014 in corresponding International Patent Application No. PCT/CN2013/084265.
Extended European search report dated Jan. 8, 2016 in corresponding European Patent Application No. 13883756.2.

* cited by examiner

OPTICAL MODULE AND FABRICATION METHOD THEREOF

CROSS-REFERENCE TO RELATED APPLICATIONS

This application is a continuation of International Application No. PCT/CN2013/084265, filed on Sep. 26, 2013, which claims priority to Chinese Patent Application No. 201310155648.1, filed on Apr. 28, 2013, both of which are hereby incorporated by reference in their entireties.

TECHNICAL FIELD

The present invention relates to the field of optical communication technologies, and in particular, to an optical module and a fabrication method thereof.

BACKGROUND

A passive optical network (Passive Optical Network, PON) does not include an electronic component or electrical power supply but includes an optical line terminal (Optical Line Terminal, OLT) that is installed at a central control station and a batch of matching optical network units (Optical Network Unit, ONU) that are installed at a user site. An optical distribution network (Optical Distribution Network, ODN) between the OLT and the ONUs includes optical fibers, a passive optical splitter or a coupler, and the like. The ODN is formed by passive components such as an optical splitter (Splitter), without requiring an expensive active electronic device.

An access network of a next generation develops towards high bandwidth of 10G. The PON network is subject to a 1:64 or even 1:128 application. In the prior art, an optical module on the OLT side has low output optical power. Therefore, the ONU side needs to use a high-sensitivity component. For example, a 10G optical module on the OLT side uses an electro-absorption modulated laser (Electro-absorption Modulated Laser, EML) to transmit an optical signal, and its specification of the output optical power is 2-6 dBm. To meet a power budget need of 29 dBm specified in a related protocol, sensitivity on the ONU side needs to reach 2−29=−27 dBm. At present, such a power budget can be implemented only by a high-sensitivity APD chip. Moreover, the APD chip works in a multiplication mode. When input optical power increases, the APD chip is more prone to burn. Therefore, in the prior art, the low output optical power of an optical module greatly restricts use of optical components on the ONU side, and severely hinders development of the access network towards high bandwidth.

SUMMARY

Embodiments of the present invention provide an optical module and a fabrication method thereof, which can increase output optical power of the optical module.

To resolve the foregoing technical problem, the embodiments of the present invention disclose the following technical solutions.

A first aspect provides an optical module, including an optical component, a substrate, and a laser, an electro-absorption modulator, and a semiconductor optical amplifier that grow on the substrate, where the electro-absorption modulator is located between the laser and the semiconductor optical amplifier.

The laser is configured to output an optical signal after power-on.

The electro-absorption modulator is configured to perform signal modulation on the optical signal output by the laser.

The semiconductor optical amplifier is configured to amplify the optical signal modulated by the electro-absorption modulator.

The optical component is configured to perform deflection and convergence for the optical signal amplified by the semiconductor optical amplifier and output the optical signal.

With reference to the first aspect, in a first possible implementation manner, the optical module further includes a semiconductor refrigerator, where the semiconductor refrigerator abuts against the substrate and is located on one side of the substrate that is opposite to the side of the substrate where the laser, the electro-absorption modulator, and the semiconductor optical amplifier are located.

With reference to the first aspect and/or the first possible implementation manner, in a second possible implementation manner, a material of the substrate is InP.

A second aspect provides a method for fabricating an optical module, including:

growing an epitaxial material of a laser on a substrate;

etching the epitaxial material of the laser to acquire a laser and an electro-absorption modulator window;

growing an epitaxial material of an electro-absorption modulator in the electro-absorption modulator window on the substrate;

etching the epitaxial material of the electro-absorption modulator to acquire an electro-absorption modulator and a semiconductor optical amplifier window, where the electro-absorption modulator is located between the laser and the semiconductor optical amplifier window;

growing an epitaxial material of a semiconductor optical amplifier in the semiconductor optical amplifier window on the substrate;

etching the epitaxial material of the semiconductor optical amplifier to acquire a semiconductor optical amplifier, where the electro-absorption modulator is located between the laser and the semiconductor optical amplifier; and assembling an optical component on one side of the semiconductor optical amplifier, and ensuring that the semiconductor optical amplifier is located between the electro-absorption modulator and the optical component; where:

the laser outputs an optical signal after power-on; the electro-absorption modulator performs signal modulation on the optical signal output by the laser; the semiconductor optical amplifier amplifies the optical signal modulated by the electro-absorption modulator; the optical component performs deflection and convergence for the optical signal amplified by the semiconductor optical amplifier and outputs the optical signal.

With reference to the second aspect, in a first possible implementation manner, the method further includes:

abutting a semiconductor refrigerator against the substrate, where the semiconductor refrigerator is located on one side of the substrate that is opposite to the side of the substrate where the laser, the electro-absorption modulator, and the semiconductor optical amplifier are located.

A third aspect provides an optical module, including an optical component, a substrate, and a laser, a semiconductor optical amplifier, and an electro-absorption modulator that grow on the substrate, where the semiconductor optical amplifier is located between the laser and the electro-absorption modulator.

The laser is configured to output an optical signal after power-on.

The semiconductor optical amplifier is configured to amplify the optical signal output by the laser.

The electro-absorption modulator is configured to perform signal modulation on the optical signal amplified by the semiconductor optical amplifier.

The optical component is configured to perform deflection and convergence for the optical signal modulated by the electro-absorption modulator and output the optical signal.

With reference to the third aspect, in a first possible implementation manner, the optical module further includes a semiconductor refrigerator, where the semiconductor refrigerator abuts against the substrate and is located on one side of the substrate that is opposite to the side of the substrate where the laser, the semiconductor optical amplifier, and the electro-absorption modulator are located.

With reference to the third aspect and/or the first possible implementation manner, in a second possible implementation manner, a material of the substrate is InP.

A fourth aspect provides a method for fabricating an optical module, including:

growing an epitaxial material of a laser on a substrate;

etching the epitaxial material of the laser to acquire a laser and a semiconductor optical amplifier window;

growing an epitaxial material of a semiconductor optical amplifier in the semiconductor optical amplifier window on the substrate;

etching the epitaxial material of the semiconductor optical amplifier to acquire a semiconductor optical amplifier and an electro-absorption modulator window, where the semiconductor optical amplifier is located between the laser and the electro-absorption modulator window;

growing an epitaxial material of an electro-absorption modulator in the electro-absorption modulator window on the substrate;

etching the epitaxial material of the electro-absorption modulator to acquire an electro-absorption modulator, where the semiconductor optical amplifier is located between the laser and the electro-absorption modulator; and assembling an optical component on one side of the electro-absorption modulator, and ensuring that the electro-absorption modulator is located between the semiconductor optical amplifier and the optical component; where:

the laser outputs an optical signal after power-on; the semiconductor optical amplifier amplifies the optical signal output by the laser; the electro-absorption modulator performs signal modulation on the optical signal amplified by the semiconductor optical amplifier; the optical component performs deflection and convergence for the optical signal modulated by the electro-absorption modulator and outputs the optical signal.

With reference to the fourth aspect, in a first possible implementation manner, the method further includes:

abutting a semiconductor refrigerator against the substrate, where the semiconductor refrigerator is located on one side of the substrate that is opposite to the side of the substrate where the laser, the semiconductor optical amplifier, and the electro-absorption modulator are located.

A fifth aspect further provides a passive optical network, including an optical line terminal and an optical network unit, where the optical line terminal is connected to the optical network unit by using an optical transmission channel;

the optical line terminal is configured to send Ethernet data to the optical network unit over the optical transmission channel, and receive, over the optical transmission channel, Ethernet data uploaded by the optical network unit; and the optical network unit is configured to receive, over the optical transmission channel, the Ethernet data sent by the optical line terminal, and upload the Ethernet data to the optical line terminal over the optical transmission channel.

The optical line terminal includes the optical module described in the first aspect.

A sixth aspect further provides a passive optical network, including an optical line terminal and an optical network unit, where the optical line terminal is connected to the optical network unit by using an optical transmission channel;

the optical line terminal is configured to send Ethernet data to the optical network unit over the optical transmission channel, and receive, over the optical transmission channel, Ethernet data uploaded by the optical network unit; and the optical network unit is configured to receive, over the optical transmission channel, the Ethernet data sent by the optical line terminal, and upload the Ethernet data to the optical line terminal over the optical transmission channel.

The optical line terminal includes the optical module described in the third aspect.

According to the embodiments of the present invention, an electro-absorption modulated laser is integrated with a semiconductor optical amplifier, and an optical signal output by the laser is amplified, thereby increasing optical power output by an optical module and having a lower requirement on sensitivity of an optical component on an ONU side. For example, when the optical power output by the optical module reaches 10 dBm, a low-sensitivity PIN chip instead of an APD chip may be used on the ONU side. Meanwhile, use of a low-sensitivity component significantly reduces networking costs and promotes development of an access network towards high bandwidth.

DESCRIPTION OF EMBODIMENTS

To make a person skilled in the art better understand the technical solutions in the embodiments of the present invention, and make the objectives, features, and advantages of the embodiments of the present invention clearer for understanding, the following further describes the technical solutions in the embodiments of the present invention in detail with reference to the accompanying drawings.

Figure 1:
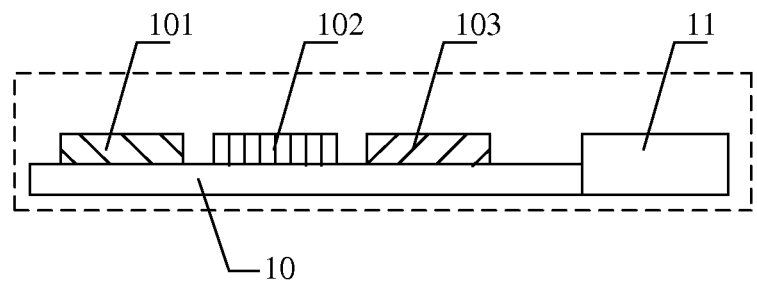
FIG. 1 is a schematic structural diagram of an optical module according to an embodiment of the present invention.

Refer to FIG. 1, which is a schematic structural diagram of an optical module according to an embodiment of the present invention.

The optical module may include a substrate 10, a laser 101, an electro-absorption modulator 102, and a semiconductor optical amplifier 103 that grow on the substrate 10, and an optical component 11. The electro-absorption modulator 102 is located between the laser 101 and the semiconductor optical amplifier 103, and these three components may be arranged in a line on the substrate 10. A combination of the laser 101 and the electro-absorption modulator 102 is an EML.

The laser 101 is configured to output an optical signal after power-on; the electro-absorption modulator 102 is configured to perform signal modulation on the optical signal output by the laser 101; the semiconductor optical amplifier 103 is configured to amplify the optical signal modulated by the electro-absorption modulator 102; the optical component 11 is configured to perform deflection and convergence for the optical signal amplified by the semiconductor optical amplifier 103 and output the optical signal.

According to this embodiment of the present invention, an electro-absorption modulated laser is integrated with a semiconductor optical amplifier, and an optical signal output by the laser is amplified, thereby increasing optical power output by an optical module and having a lower requirement on sensitivity of an optical component on an ONU side. For example, when the optical power output by the optical module reaches 10 dBm, a low-sensitivity PIN chip instead of an APD chip may be used on the ONU side. Meanwhile, use of a low-sensitivity component significantly reduces networking costs and promotes development of an access network towards high bandwidth.

Figure 2:
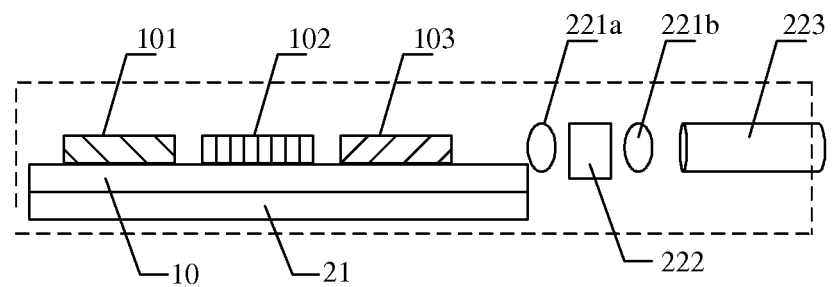
FIG. 2 is a schematic structural diagram of another optical module according to an embodiment of the present invention.

In another embodiment of the present invention, as shown in FIG. 2, the optical module may further include a semiconductor refrigerator 21, where the semiconductor refrigerator 21 abuts against the substrate 10 and is located on one side of the substrate that is opposite to the side of the substrate where the laser 101, the electro-absorption modulator 102, and the semiconductor optical amplifier 103 are located.

In the foregoing embodiments, luminescent materials of the laser and the electro-absorption modulator and a material of the semiconductor optical amplifier may be InP doped with GaAs. Therefore, an InP material may be selected as the substrate to grow epitaxial layers of both the EML (the laser and the electro-absorption modulator) and the semiconductor optical amplifier. An internal structure of the EML and an internal structure of the semiconductor optical amplifier are similar to those in the prior art, which are not further described herein.

The optical component in the foregoing embodiments may be similar to that in the prior art. For example, as shown in FIG. 2, the optical component includes an optical lens 221a/221b, an optical isolator 222, and an optical fiber 223. The optical lens 221a is mainly configured to converge optical signals output by the semiconductor optical amplifier 103, so as to improve coupling efficiency of the optical signals. The optical isolator 222 is configured to enable an optical signal that passes through the optical lens 221a to deflect by 90 degrees, so as to prevent light reflected back to the laser from forming a resonance effect and prevent an impact on performance. The optical lens 221b is mainly configured to couple an optical signal that passes through the optical isolator 222 into the optical fiber 223. The optical fiber 223 outputs the optical signal that passes through the optical isolator 222 out of the optical module.

An embodiment of the present invention further provides a passive optical network, including an optical line terminal and an optical network unit; where: the optical line terminal is connected to the optical network unit by using an optical transmission channel; the optical line terminal is configured to send Ethernet data to the optical network unit over the optical transmission channel, and receive, over the optical transmission channel, Ethernet data uploaded by the optical network unit; the optical network unit is configured to receive, over the optical transmission channel, the Ethernet data sent by the optical line terminal, and upload the Ethernet data to the optical line terminal over the optical transmission channel; the optical line terminal includes the optical module shown in FIG. 1 or FIG. 2.

Figure 3:
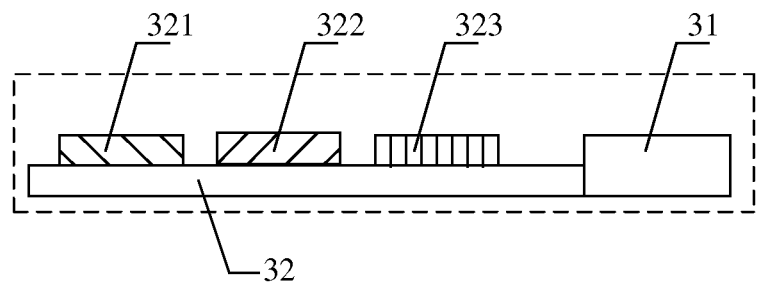
FIG. 3 is a schematic structural diagram of another optical module according to an embodiment of the present invention.

Refer to FIG. 3, which is a schematic structural diagram of another optical module according to an embodiment of the present invention.

The optical module in this embodiment differs from the optical module in the foregoing embodiment in that: an arrangement sequence of a laser, an electro-absorption modulator, and a semiconductor optical amplifier that grow on a substrate is different from that in the foregoing embodiment; in this embodiment, the semiconductor optical amplifier is located between the laser and the electro-absorption modulator.

Specifically, the optical module may include an optical component 31, a substrate 32, and a laser 321, a semiconductor optical amplifier 322, and an electro-absorption modulator 323 that grow on the substrate 32, where the semiconductor optical amplifier 322 is located between the laser 321 and the electro-absorption modulator 323 and these three components may be arranged in a line.

The laser 321 is configured to output an optical signal after power-on. The semiconductor optical amplifier 322 is configured to amplify the optical signal output by the laser 321. The electro-absorption modulator 323 is configured to perform signal modulation on the optical signal amplified by the semiconductor optical amplifier 322. The optical component 31 is configured to perform deflection and convergence for the optical signal modulated by the electro-absorption modulator 323 and output the optical signal out of the optical module.

According to this embodiment of the present invention, an electro-absorption modulated laser is integrated with a semiconductor optical amplifier, and an optical signal output by the laser is amplified, thereby increasing optical power output by an optical module and having a lower requirement on sensitivity of an optical component on an ONU side. For example, when the optical power output by the optical module reaches 10 dBm, a low-sensitivity PIN chip instead of an APD chip may be used on the ONU side. Meanwhile, use of a low-sensitivity component significantly reduces networking costs and promotes development of an access network towards high bandwidth.

Figure 4:
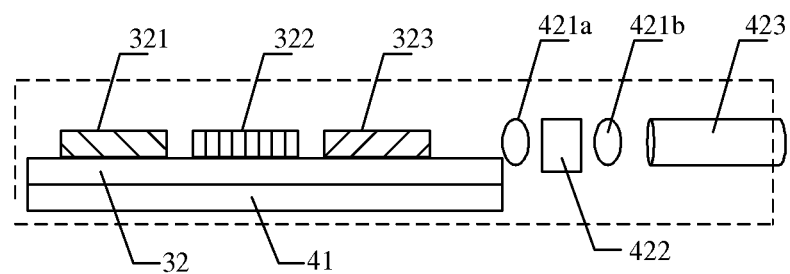
FIG. 4 is a schematic structural diagram of another optical module according to an embodiment of the present invention.

In another embodiment of the present invention, as shown in FIG. 4, the optical module may further include a semiconductor refrigerator 41, where the semiconductor refrigerator 41 abuts against the substrate 32 and is located on one side of substrate 32 that is opposite to the side of the substrate 32 where the laser 321, the semiconductor optical amplifier 322, and the electro-absorption modulator 232 are located. The semiconductor refrigerator 41 arranged on the substrate may facilitate heat dissipation of a component that outputs light by using high power.

Similar to the foregoing embodiments, in this embodiment, an InP material may also be selected as the substrate to grow epitaxial layers of both the laser, the semiconductor optical amplifier, and the electro-absorption modulator. Internal structures of the laser and the electro-absorption modulator and an internal structure of the semiconductor optical amplifier are similar to those in the prior art, which are not further described herein.

The optical component may be similar to the optical component in the foregoing embodiments. As shown in FIG. 4, the optical component includes an optical lens 421a/421b, an optical isolator 422, and an optical fiber 423. The optical lens 421a is configured to converge optical signals output by the electro-absorption modulator 323, so as to improve coupling efficiency of the optical signals. The optical isolator 422 is configured to enable an optical signal that passes through the optical lens 421a to deflect by 90 degrees, so as to prevent light reflected back to the laser from forming a resonance effect and prevent an impact on performance. The optical lens 421b is configured to couple an optical signal that passes through the optical isolator 422 into the optical fiber 423. The optical fiber 423 outputs the optical signal that passes through the optical isolator 422 out of the optical module.

An embodiment of the present invention further provides a passive optical network, including an optical line terminal and an optical network unit; where: the optical line terminal is connected to the optical network unit by using an optical transmission channel; the optical line terminal is configured to send Ethernet data to the optical network unit over the optical transmission channel, and receive, over the optical transmission channel, Ethernet data uploaded by the optical network unit; the optical network unit is configured to receive, over the optical transmission channel, the Ethernet data sent by the optical line terminal, and upload the Ethernet data to the optical line terminal over the optical transmission channel; the optical line terminal includes the optical module as shown in FIG. 3 or FIG. 4.

The foregoing describes the optical module embodiments of the present invention. The following describes a method for fabricating the foregoing optical modules.

Figure 5:
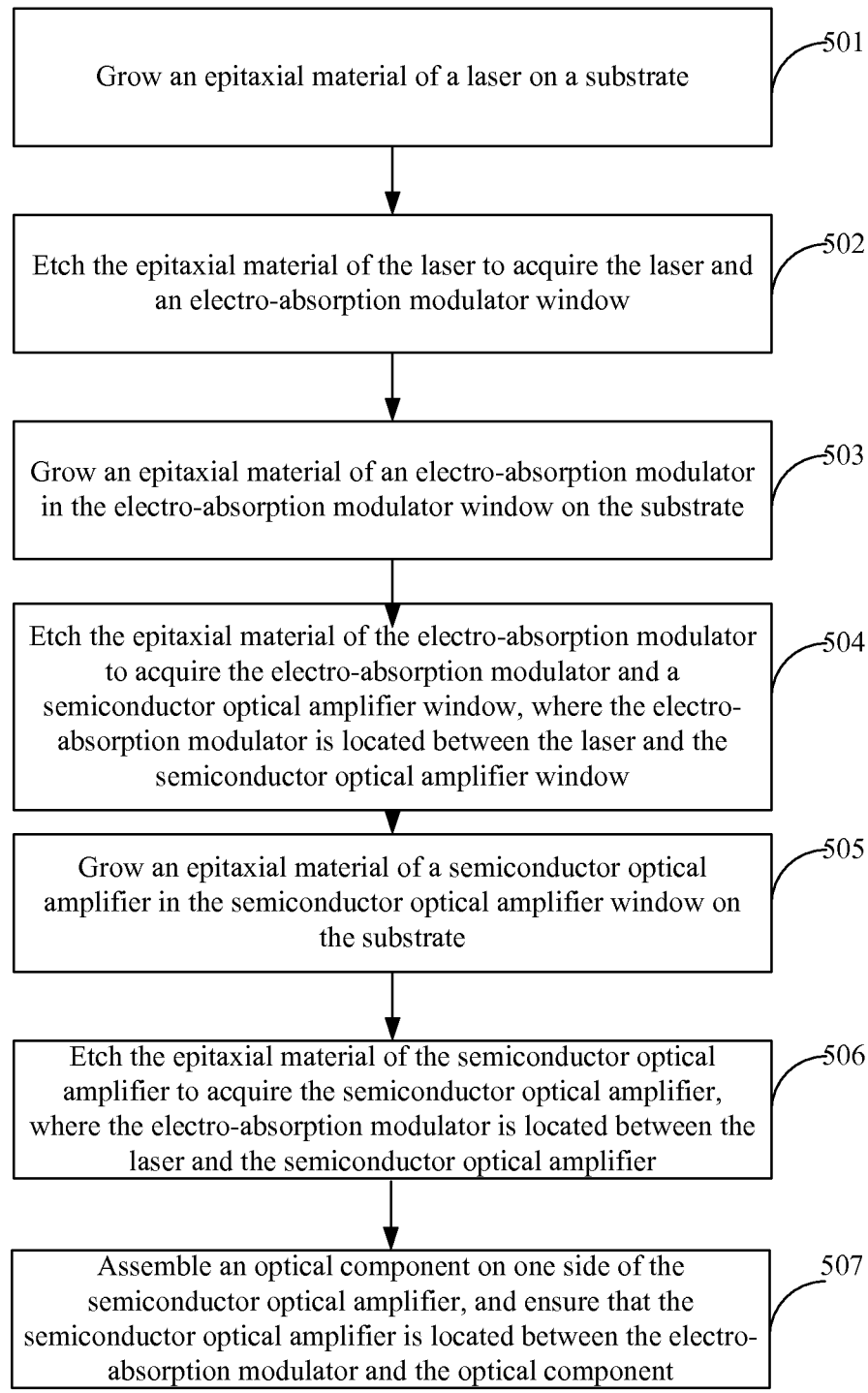
FIG. 5 is a flowchart of a method for fabricating an optical module according to an embodiment of the present invention.

Refer to FIG. 5, which is a flowchart of a method for fabricating an optical module according to an embodiment of the present invention.

This embodiment of the present invention is used for fabricating the optical module shown in FIG. 1 or FIG. 2. The method may include:

Step 501: Grow an epitaxial material of a laser on a substrate.

Figure 6A:
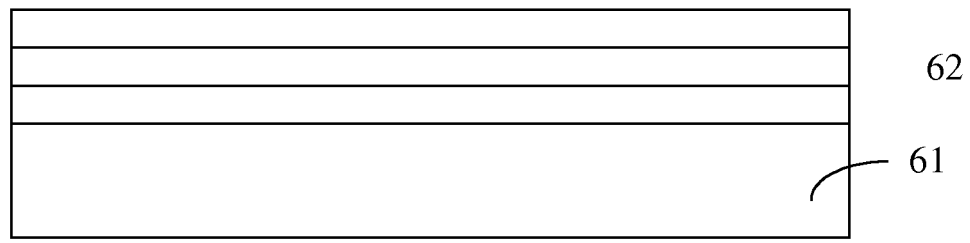
FIG. 6a to FIG. 6d are schematic diagrams of a process of fabricating the optical module according to the embodiment shown in FIG. 5.

As shown in FIG. 6a, the substrate 61 may be made of InP, and then an epitaxial material 62 of the laser is grown on the substrate 61. The epitaxial material of the laser and a growing process are similar to those in the prior art, which are not further described herein.

Step 502: Etch the epitaxial material of the laser to acquire the laser and an electro-absorption modulator window.

Figure 6B:

After the epitaxial material 62 of the laser is grown, the epitaxial material is etched to acquire a laser 63, and further the electro-absorption modulator window is acquired by etching, as shown in FIG. 6b.

Step 503: Grow an epitaxial material of an electro-absorption modulator in the electro-absorption modulator window on the substrate.

The epitaxial material of the electro-absorption modulator is grown in electro-absorption modulator window, which is acquired by etching, on the substrate 61, where the epitaxial material of the electro-absorption modulator and a grown process thereof are similar to those in the prior art.

In another embodiment, before the epitaxial material of the electro-absorption modulator is grown, a protection layer, for example, a silicon dioxide layer, may be firstly deposited to cover the laser, and then the epitaxial material of the electro-absorption modulator is deposited in the electro-absorption modulator window on the substrate.

Step 504: Etch the epitaxial material of the electro-absorption modulator to acquire the electro-absorption modulator and a semiconductor optical amplifier window, where the electro-absorption modulator is located between the laser and the semiconductor optical amplifier window.

Figure 6C:
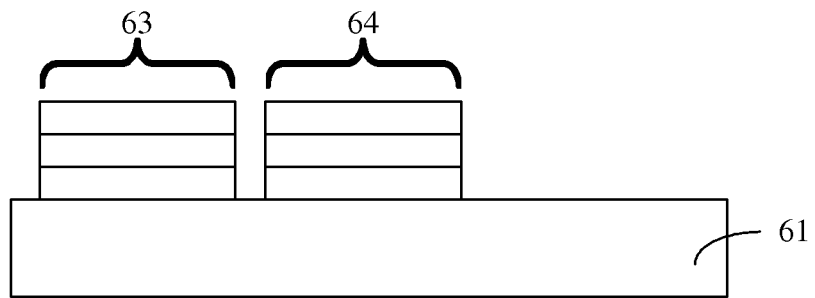

The epitaxial material of the electro-absorption modulator is etched to acquire an electro-absorption modulator 64, and further the semiconductor optical amplifier window is acquired by etching. As shown in FIG. 6c, the electro-absorption modulator 64 is located between the laser 63 and the semiconductor optical amplifier window.

If the laser is covered by a silicon dioxide protection layer in the previous step, the silicon dioxide layer may be removed after the electro-absorption modulator 64 is acquired by etching.

Step 505: Grow an epitaxial material of a semiconductor optical amplifier in the semiconductor optical amplifier window on the substrate.

The epitaxial material of the semiconductor optical amplifier is grown in the semiconductor optical amplifier window, which is acquired by etching, on the substrate 61, where the epitaxial material of the semiconductor optical amplifier and a growing process thereof are similar to those in the prior art.

In another embodiment, before the epitaxial material of the semiconductor optical amplifier is grown, a protection layer, for example, a silicon dioxide layer, may be firstly deposited to cover the laser and the electro-absorption modulator, and then the epitaxial material of the semiconductor optical amplifier is deposited in the electro-absorption modulator window on the substrate.

Step 506: Etch the epitaxial material of the semiconductor optical amplifier to acquire the semiconductor optical amplifier, where the electro-absorption modulator is located between the laser and the semiconductor optical amplifier.

Figure 6D:
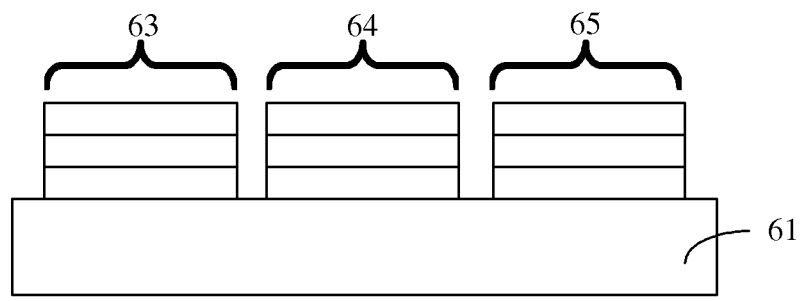

The epitaxial material of the semiconductor optical amplifier is etched to acquire a semiconductor optical amplifier 65. As shown in FIG. 6d, the electro-absorption modulator 64 is located between the laser 63 and the semiconductor optical amplifier 65.

If the laser and the electro-absorption modulator are covered by a silicon dioxide protection layer in the previous step, the silicon dioxide layer may be removed after the semiconductor optical amplifier 65 is acquired by etching.

Step 507: Assemble an optical component on one side of the semiconductor optical amplifier, and ensure that the semiconductor optical amplifier is located between the electro-absorption modulator and the optical component.

According to the foregoing steps, the laser 63, the electro-absorption modulator 64, and the semiconductor optical amplifier 65 may be acquired on the substrate, and the electro-absorption modulator 64 is located between the laser 63 and the semiconductor optical amplifier 65; the laser 63 outputs an optical signal after power-on; the electro-absorption modulator 64 performs signal modulation on the optical signal output by the laser 63; the semiconductor optical amplifier 65 amplifies the optical signal modulated by the electro-absorption modulator 64; the optical component performs deflection and convergence for the optical signal amplified by the semiconductor optical amplifier 65 and outputs the optical signal.

According to this embodiment of the present invention, an electro-absorption modulated laser is integrated with a semiconductor optical amplifier, and an optical signal output by the laser is amplified, thereby increasing optical power output by an optical module and having a lower requirement on sensitivity of an optical component on an ONU side. For example, when the optical power output by the optical module reaches 10 dBm, a low-sensitivity PIN chip instead of an APD chip may be used on the ONU side. Meanwhile, use of a low-sensitivity component significantly reduces networking costs and promotes development of an access network towards high bandwidth.

In another embodiment of the present invention, the method may further include:

abutting a semiconductor refrigerator against the substrate, where the semiconductor refrigerator is located on one side of the substrate that is opposite to the side of the substrate where the laser, the electro-absorption modulator, and the semiconductor optical amplifier are located.

The semiconductor refrigerator may abut against the substrate after the laser, the electro-absorption modulator, and the semiconductor optical amplifier are grown, or may abut against the substrate before the laser, the electro-absorption modulator, and the semiconductor optical amplifier are grown. The semiconductor refrigerator abutting against the substrate may facilitate heat dissipation of a component that outputs light by using high power.

Figure 7:
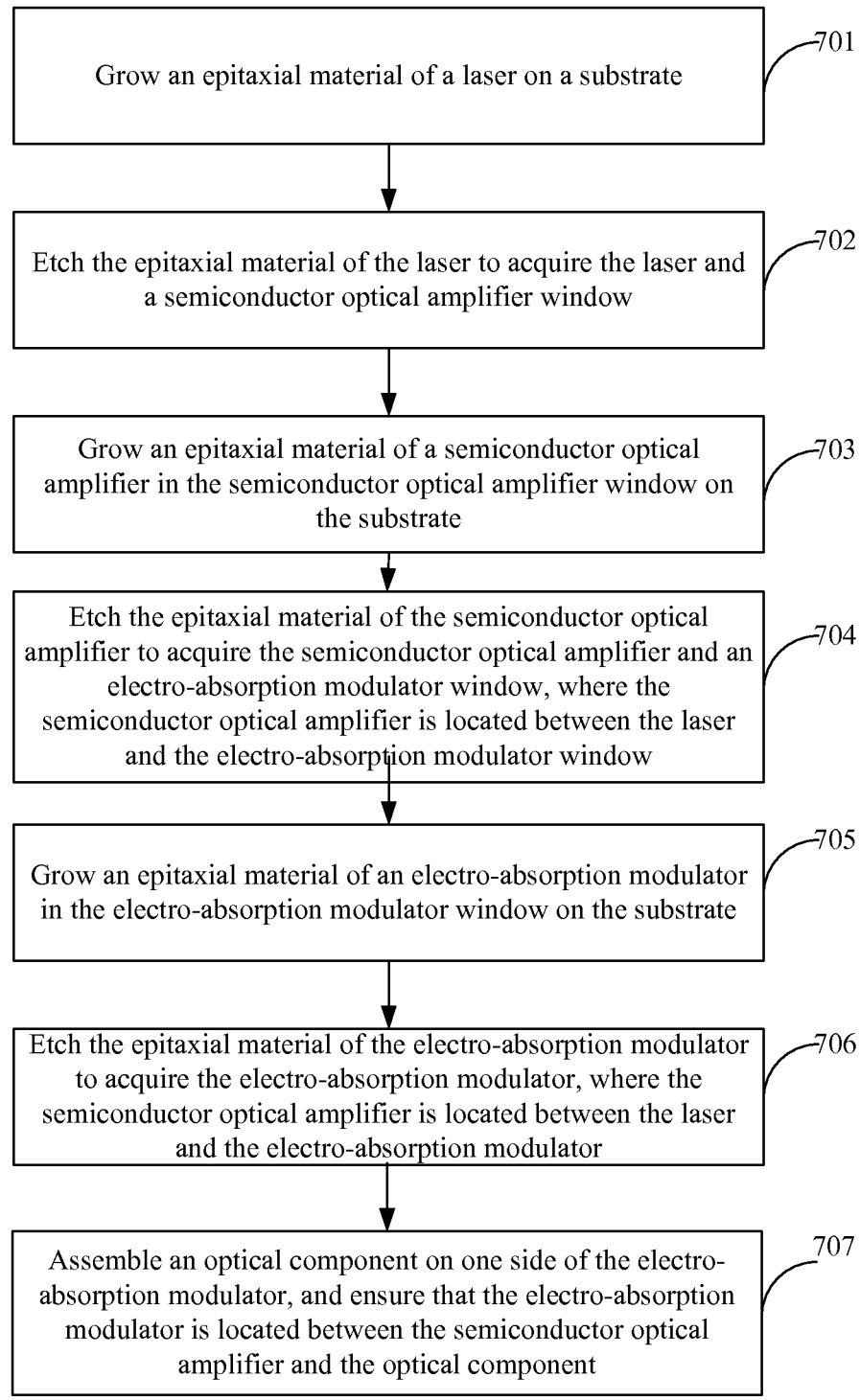
FIG. 7 is a flowchart of another method for fabricating an optical module according to an embodiment of the present invention.

Refer to FIG. 7, which is a flowchart of another method for fabricating an optical module according to an embodiment of the present invention.

This embodiment of the present invention is used for fabricating the optical module shown in FIG. 3 or FIG. 4. The method differs from the method in the foregoing embodiment only in that: In the foregoing embodiment, after the laser is acquired by etching, the electro-absorption modulator is first grown, and then the semiconductor optical amplifier is grown; however, in this embodiment, the semiconductor optical amplifier is first grown, and then the electro-absorption modulator is grown.

Specifically, the method may include:

Step 701: Grow an epitaxial material of a laser on a substrate.

Step 702: Etch the epitaxial material of the laser to acquire the laser and a semiconductor optical amplifier window.

Step 703: Grow an epitaxial material of a semiconductor optical amplifier in the semiconductor optical amplifier window on the substrate.

Step 704: Etch the epitaxial material of the semiconductor optical amplifier to acquire the semiconductor optical amplifier and an electro-absorption modulator window, where the semiconductor optical amplifier is located between the laser and the electro-absorption modulator window.

Step 705: Grow an epitaxial material of an electro-absorption modulator in the electro-absorption modulator window on the substrate.

Step 706: Etch the epitaxial material of the electro-absorption modulator to acquire the electro-absorption modulator, where the semiconductor optical amplifier is located between the laser and the electro-absorption modulator.

Step 707: Assemble an optical component on one side of the electro-absorption modulator, and ensure that the electro-absorption modulator is located between the semiconductor optical amplifier and the optical component.

According to the foregoing steps, the laser, the electro-absorption modulator, and the semiconductor optical amplifier may be acquired on the substrate, where the semiconductor optical amplifier is located between the laser and the electro-absorption modulator and these three components may be arranged in a line on the substrate; the laser outputs an optical signal after power-on; the semiconductor optical amplifier amplifies the optical signal output by the laser; the electro-absorption modulator performs signal modulation on the optical signal amplified by the semiconductor optical amplifier; the optical component performs deflection and convergence for the optical signal modulated by the electro-absorption modulator and outputs the optical signal.

This method embodiment differs from the foregoing method embodiment only in that the growing sequence and growing positions of components are different. The method for growing the components is similar to that described in the foregoing embodiment, which is not further described herein.

According to this embodiment of the present invention, an electro-absorption modulated laser is integrated with a semiconductor optical amplifier, and an optical signal output by the laser is amplified, thereby increasing optical power output by an optical module and having a lower requirement on sensitivity of an optical component on an ONU side. For example, when the optical power output by the optical module reaches 10 dBm, a low-sensitivity PIN chip instead of an APD chip may be used on the ONU side. Meanwhile, use of a low-sensitivity component significantly reduces networking costs and promotes development of an access network towards high bandwidth.

In another embodiment of the present invention, the semiconductor refrigerator may also abut against the substrate, where the semiconductor refrigerator is located on one side of the substrate that is opposite to the side of the substrate where the laser, the semiconductor optical amplifier, and the electro-absorption modulator are located. The semiconductor refrigerator abutting against the substrate may facilitate heat dissipation of a component that outputs light by using high power.

This embodiment of the present invention may be applicable to a PON network, that is, a network mainly composed of a 10G PON OLT-side optical module, an ONU-side optical module, and an optical splitter, where a data service is transmitted and returned over an optical fiber.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of the present invention essentially, or the part contributing to the prior art, or a part of the technical solutions may be implemented in a form of a software product. The software product is stored in a storage medium and includes several instructions for instructing a computer device (which may be a personal computer, a server, or a network device) or a processor to perform all or a part of the steps of the methods described in the embodiments of the present invention. The foregoing storage medium includes: any medium that can store program code, such as a USB flash drive, a removable hard disk, a read-only memory (Read-Only Memory, ROM), a random access memory (Random Access Memory, RAM), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A method for fabricating an optical module, comprising:
   growing an epitaxial material of a laser on a substrate;
   etching the epitaxial material of the laser to acquire the laser and an electro-absorption modulator window;
   growing an epitaxial material of an electro-absorption modulator in the electro-absorption modulator window on the substrate;
   etching the epitaxial material of the electro-absorption modulator to acquire an electro-absorption modulator and a semiconductor optical amplifier window, wherein the electro-absorption modulator is located between the laser and the semiconductor optical amplifier window;
   growing an epitaxial material of a semiconductor optical amplifier in the semiconductor optical amplifier window on the substrate;
   etching the epitaxial material of the semiconductor optical amplifier to acquire a semiconductor optical amplifier, wherein the electro-absorption modulator is located between the laser and the semiconductor optical amplifier; and
   assembling an optical component on one side of the semiconductor optical amplifier, and ensuring that the semiconductor optical amplifier is located between the electro-absorption modulator and the optical component; wherein:
   the laser outputs an optical signal after power-on; the electro-absorption modulator performs signal modulation on the optical signal output by the laser; the semiconductor optical amplifier amplifies the optical signal modulated by the electro-absorption modulator; the optical component performs deflection and convergence for the optical signal amplified by the semiconductor optical amplifier and outputs the optical signal.

2. The method according to claim 1, further comprising:
   abutting a semiconductor refrigerator against the substrate, wherein the semiconductor refrigerator is located on one side of the substrate that is opposite to the side of the substrate wherein the laser, the electro-absorption modulator, and the semiconductor optical amplifier are located.

3. A method for fabricating an optical module, comprising:
   growing an epitaxial material of a laser on a substrate;
   etching the epitaxial material of the laser to acquire a laser and a semiconductor optical amplifier window;
   growing an epitaxial material of a semiconductor optical amplifier in the semiconductor optical amplifier window on the substrate;
   etching the epitaxial material of the semiconductor optical amplifier to acquire a semiconductor optical amplifier and an electro-absorption modulator window, wherein the semiconductor optical amplifier is located between the laser and the electro-absorption modulator window; and
   growing an epitaxial material of an electro-absorption modulator in the electro-absorption modulator window on the substrate;
   etching the epitaxial material of the electro-absorption modulator to acquire an electro-absorption modulator, wherein the semiconductor optical amplifier is located between the laser and the electro-absorption modulator; and
   assembling an optical component on one side of the electro-absorption modulator, and ensuring that the electro-absorption modulator is located between the semiconductor optical amplifier and the optical component; wherein:
   the laser outputs an optical signal after power-on; the semiconductor optical amplifier amplifies the optical signal output by the laser; the electro-absorption modulator performs signal modulation on the optical signal amplified by the semiconductor optical amplifier; the optical component performs deflection and convergence for the optical signal modulated by the electro-absorption modulator and outputs the optical signal.

4. The method according to claim 3, further comprising:
   abutting the semiconductor refrigerator against the substrate, wherein the semiconductor refrigerator is located on one side of the substrate that is opposite to the side of the substrate wherein the laser, the semiconductor optical amplifier, and the electro-absorption modulator are located.

* * * * *